US009530902B2

(12) United States Patent
Kostamo

(10) Patent No.: US 9,530,902 B2
(45) Date of Patent: Dec. 27, 2016

(54) TWO-DIMENSIONAL GUARD STRUCTURE AND A RADIATION DETECTOR WITH THE SAME

(75) Inventor: Pasi Kostamo, Espoo (FI)

(73) Assignee: Oxford Instruments Analytical Oy, Espoo (FI)

( * ) Notice: Subject to any disclaimer, the term of this patent is extended or adjusted under 35 U.S.C. 154(b) by 1062 days.

(21) Appl. No.: 13/528,065

(22) Filed: Jun. 20, 2012

(65) Prior Publication Data

US 2013/0341752 A1    Dec. 26, 2013

(51) Int. Cl.
| | |
|---|---|
| *H01L 31/02* | (2006.01) |
| *H01L 31/115* | (2006.01) |
| *H01L 31/0224* | (2006.01) |
| *H01L 29/06* | (2006.01) |

(52) U.S. Cl.
CPC ..... *H01L 31/02005* (2013.01); *H01L 29/0619* (2013.01); *H01L 31/022408* (2013.01); *H01L 31/115* (2013.01)

(58) Field of Classification Search
CPC ............ H01L 31/115; H01L 31/022408; H01L 31/02005; G01T 1/24; G01T 1/241
See application file for complete search history.

(56) References Cited

U.S. PATENT DOCUMENTS

| | | | | |
|---|---|---|---|---|
| 6,541,836 B2* | 4/2003 | Iwanczyk | ......... | H01L 27/14601 257/429 |
| 7,238,949 B2* | 7/2007 | Struder | ............ | H01L 27/14603 250/370.01 |
| 8,314,468 B2* | 11/2012 | Hullinger | .............. | G01T 1/2928 250/370.14 |
| 8,421,172 B2* | 4/2013 | Morichi | ................ | G01T 1/2928 257/428 |
| 8,921,797 B2* | 12/2014 | Kostamo | ................. | G01T 1/241 250/370.14 |

* cited by examiner

*Primary Examiner* — Jose R Diaz
(74) *Attorney, Agent, or Firm* — Wood, Phillips, Katz, Clark & Mortimer

(57) ABSTRACT

A semiconductor device comprises a piece of semiconductor material. On a surface of said piece of semiconductor material, a number of electrodes exist and are configured to assume different electric potentials. A guard structure comprises a two-dimensional array of conductive patches, at least some of which are left to assume an electric potential under the influence of electric potentials existing at said electrodes.

12 Claims, 5 Drawing Sheets

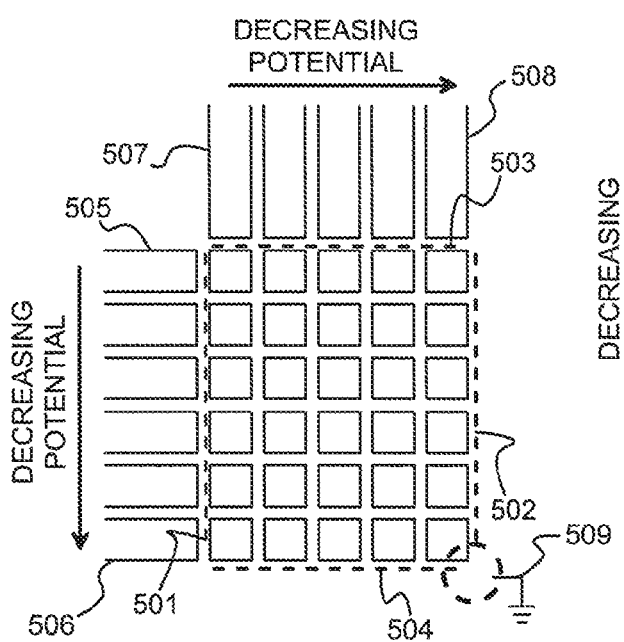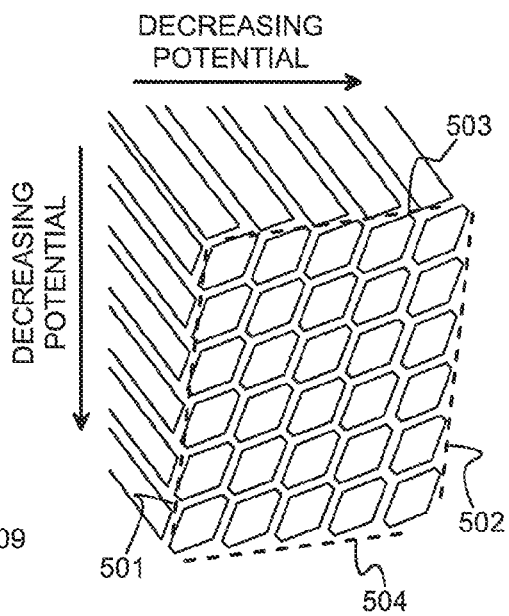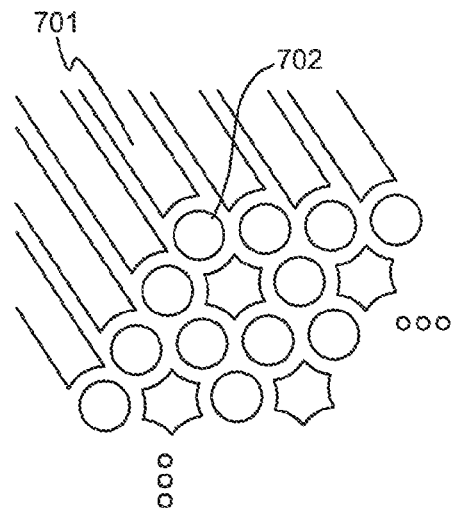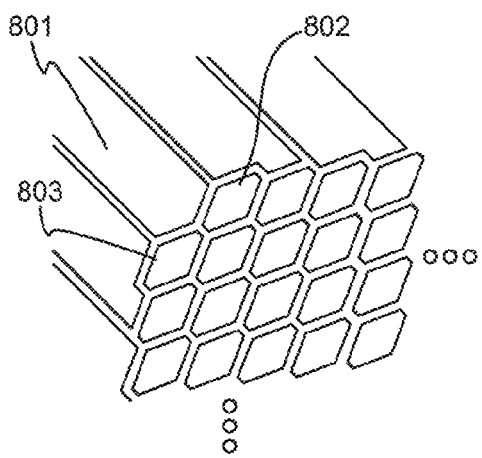
Fig. 5
Fig. 6
Fig. 7
Fig. 8
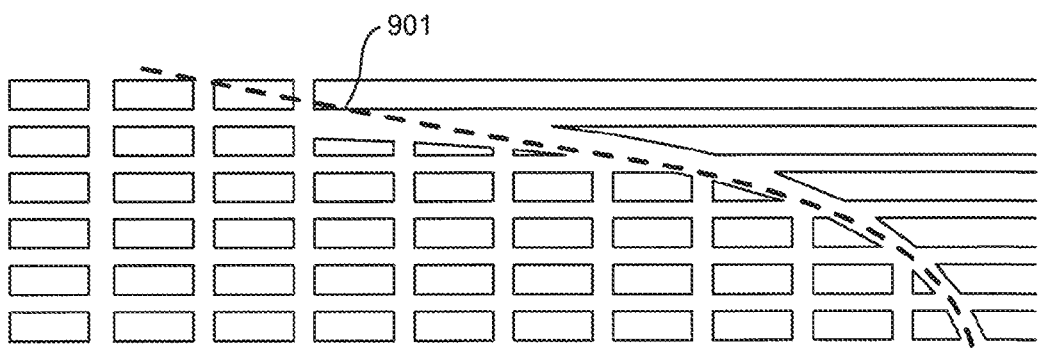
Fig. 9

TWO-DIMENSIONAL GUARD STRUCTURE AND A RADIATION DETECTOR WITH THE SAME

TECHNICAL FIELD

The invention is related to semiconductor radiation detectors. Particularly the invention is related to guard structures that are used in semiconductor radiation detectors to control the electric potential at various regions of the semiconductor chip.

BACKGROUND OF THE INVENTION

Guard structures are commonly used in semiconductor devices to control the electric potential at various regions of the semiconductor chip. They are the more important the higher voltages are used on the chip. As an example of a semiconductor where relatively high voltages exist on the chip we will consider a semiconductor radiation detector.

FIG. 1 illustrates schematically a simplified, partially cut-out silicon drift detector (SDD), which is an example of a semiconductor radiation detector used to detect electromagnetic radiation, particularly X-rays. A bulk layer 101 of semiconductor material receives and absorbs the radiation, which causes free charge carriers to appear. One surface of the bulk layer 101 comprises an arrangement of concentric p-type implantation rings, of which ring 102 is shown as an example. The concentric rings are arranged to have electric potentials of gradually increasing absolute value, so that if the potential at the center of the SDD is close to zero, the outermost ring may have a potential of e.g. −150 V. The number of rings is overly simplified in FIG. 1; in a real-life detector there may be dozens of rings.

Together with a cathode layer 103 on the opposite surface of the bulk layer, the concentric rings create, within the bulk layer, an internal electric field that drives the radiation-induced electrons towards that part of the SDD where a potential energy minimum for the signal charges is located. At or close to the center, an anode is located for collecting the radiation-induced electrons. The SDD of FIG. 1 comprises an integrated field-effect transistor (FET), the electrodes of which are shown as implantations 104, 105, and 106. The innermost implantation ring, i.e. the one closest to the FET, is the anode, from which a connection 107 is made to the gate of the FET. Alternative structures are known, in which the anode is at the very center of the SDD, and an external FET is coupled to the anode for example by bonding a separate FET chip to appropriate parts of the SDD chip.

A circular SDD with the anode and FET at or close to the center of the SDD chip has the inherent disadvantage that some of the measured radiation will hit the FET, which may disturb its operation and cause radiation damage to the crystalline material from which the FET is made. In a structure like that in FIG. 1, the FET will also reserve some active surface area. As an alternative, the so-called droplet-formed detector, also known as SD$^3$ or SDDD (Silicon Drift Detector Droplet) has been proposed. FIG. 2 illustrates schematically the surface of a droplet-formed detector, again with the number and relative size of the structural elements deliberately distorted in favor of graphical clarity. The implantation rings, the stepwise increasing potential of which create the electric field, are asymmetric so that their arched form is relatively wide on one side (on the left in FIG. 2) but narrow and pointed on the other (on the right in FIG. 2). The outermost implantation ring used for this purpose is shown as 201.

The anode region is generally shown as 202 and it may comprise conductive patches (like in FIG. 2) for bonding an external FET thereto, and/or implantations that at least partly constitute an integrated detection and amplification element such as a FET. The asymmetric form of the implantation rings brings the anode region 202 out of the active area of the detector, so it is much less exposed to radiation than in the structure of FIG. 1, and also does not cause any dead zone in detection.

According to the basic principle of drift detectors, the outermost implantation ring 201 has the highest absolute value of electric potential. In order to controllably reduce the absolute value of electric potential towards the edge 203 of the detector chip, guard rings encircle the implantation rings. FIG. 2 shows specifically an inner 204 and an outer 205 guard ring, but the number of guard rings may be anything from one to about a dozen. The guard rings may be made by implantation, and/or they may comprise trenches milled to the semiconductor material and/or conductor strips produced on its surface. The guard rings may be left floating, or a specifically selected electric potential may be coupled to each guard ring through a contact; in FIG. 2 the contacts 206 and 207 are shown as examples. The guard rings with their automatically assumed or selected potentials reduce the risk of electric breakdown and—even more importantly—help to shape the electric field inside the semiconductor material in such a way that the active volume increases.

The small graph at the top of FIG. 2 illustrates the change in electric potential along the arrow 208 that goes perpendicularly across the outermost implantation ring 201 and the two guard rings 204 and 205. At the ring proper, electric potential is constant (a large negative potential $V_{HV}$ for the implantation ring 201, and potentials $V_{G1}$ and $V_{G2}$ with stepwise decreasing absolute values for the inner and outer guard rings respectively). Between rings there is a zone of gradually changing electric potential. Here we assume that the very edge 203 of the detector chip is grounded.

There are certain drawbacks in the known semiconductor detector structures. Conductor tracks, which are not shown in e.g. FIG. 2 but which are needed to make electric contacts to the inner parts of the ring structure, must be taken across underlying zones of relatively large (by absolute value) electric potential, which may make manufacturing complicated. There are also the zones between the implantation rings, at which surface-generated currents occur. Special arrangements are needed in order to draw out those surface-generated currents so that they do not mix with the measurement of the radiation-induced signal charge.

SUMMARY OF THE INVENTION

According to a first aspect of the invention, there is provided a guard structure for controllably lowering electric potential on a surface of a semiconductor device, which is advantageous from the manufacturing point of view and offers versatility in designing the other features of semiconductor devices. According to a second aspect of the invention, there is provided a semiconductor device comprising a guard structure of the above-mentioned kind. According to a third aspect of the invention there is provided a semiconductor radiation detector in which the collection of surface current can be accomplished effectively. According to yet another aspect of the invention there is provided a semiconductor radiation detector in which advantageous techniques can be used to lead conductive tracks towards the central regions of the detector.

Advantageous objectives of the invention are achieved by using a guard structure in which conductive patches constitute a two-dimensional array.

A guard structure according to the invention is characterized by the features recited in the independent claim directed to a guard structure.

A semiconductor device according to the invention is characterized by the features recited in the independent claim directed to a semiconductor device.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF DRAWINGS

FIG. 5 illustrates a two-dimensional guard structure,
FIG. 6 illustrates another two-dimensional guard structure,
FIG. 7 illustrates another two-dimensional guard structure,
FIG. 8 illustrates another two-dimensional guard structure,
FIG. 9 illustrates another two-dimensional guard structure.

DETAILED DESCRIPTION OF EMBODIMENTS OF THE INVENTION

Figure 1:
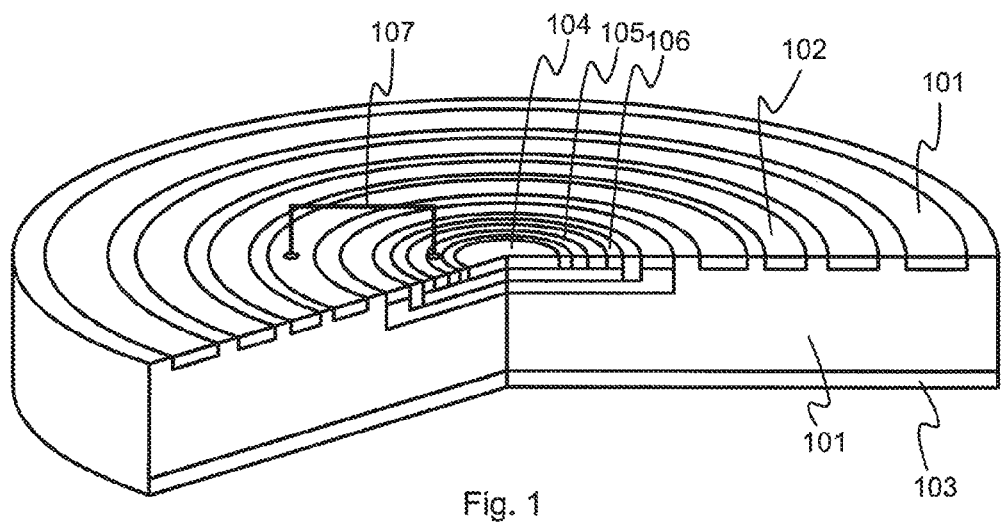
FIG. 1 illustrates a silicon drift detector.
Figure 2:
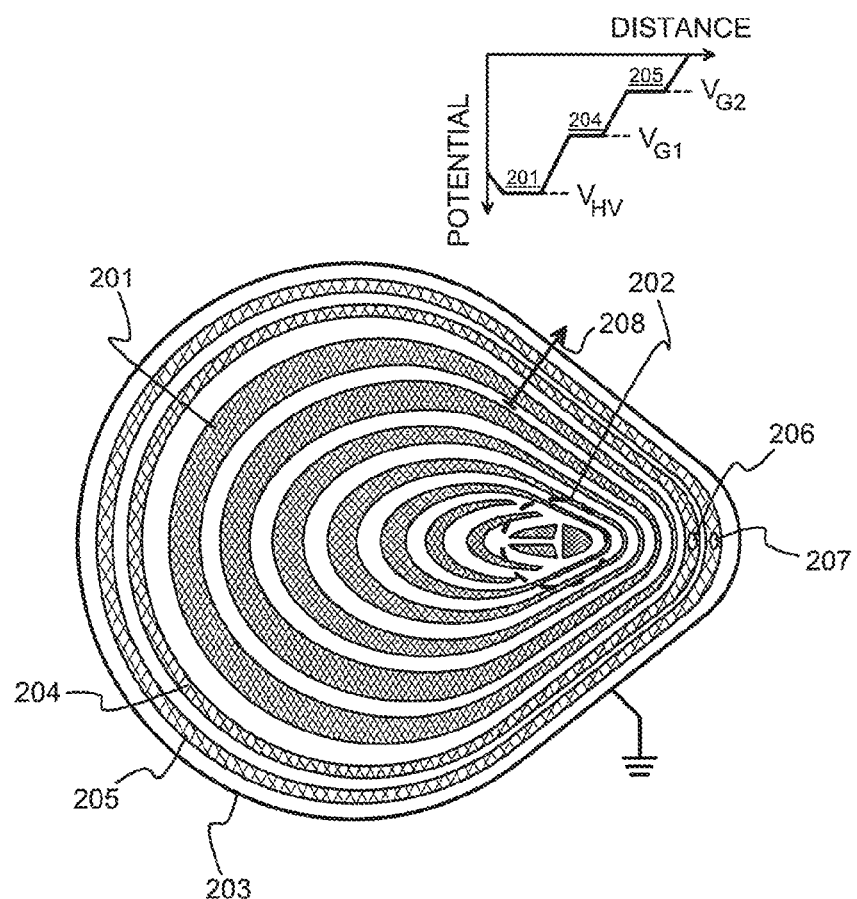
FIG. 2 illustrates a droplet-formed silicon drift detector.
Figure 3:
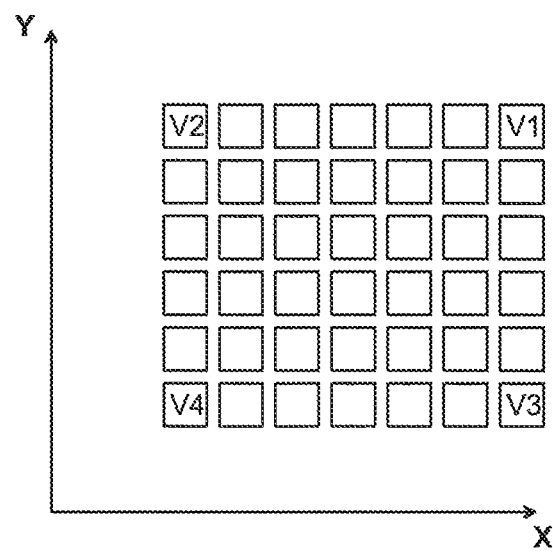
FIG. 3 illustrates an array of conductive patches.

FIG. 3 illustrates schematically a two-dimensional array of conductive patches, which are assumed to be on a surface of a semiconductor device. The semiconductor material constitutes an electric coupling between each pair of adjacent conductive patches. To be quite exact, the semiconductor material provides electric links between all conductive patches, but we assume that the relative distances between all others than immediately adjacent patches is so long, and the resistivity of the semiconductor material so high, that for most practical purposes it is sufficient to consider only the electric couplings between adjacent patches.

Saying that the patches are "conductive" means that their electric conductivity is significantly higher than that of the adjacent semiconductor material. In other words, they do not need to be e.g. metallic patches on the surface. They may be e.g. implantations of a particular conductivity type. For example considering a semiconductor radiation detector in which the signal carriers are electrons, the conductive patches may be implantations of the p-type.

Saying that the array is "two-dimensional" means that there are at least two different so-called principal directions of recurrence. In the example of FIG. 3, the principal directions of recurrence are the horizontal and vertical directions. Proceeding through the array along a principal direction of recurrence, separations between elements are repeatedly encountered, which separations give the array its characteristic form where (mutually relatively similar) elements of the array exist in organized formations. In a rectangular array, said organized formations are frequently referred to as rows and columns.

For the ease of graphical representation, we assume that the conductive patches of FIG. 3 are located in an XY-coordinate system. We also assume that the top right patch has an electric potential V1, the top left patch has an electric potential V2, the bottom right patch has an electric potential V3, and the bottom left patch has an electric potential V4. The magnitude order of the absolute values of said electric potentials is such that $|V1|>|V2|>|V3|>|V4|$. The network of electric couplings between patches through the semiconductor material makes the intermediate conductive patches assume, under influence of the electric potentials existing at the corners of the two-dimensional array, certain electric potentials.

Figure 4:
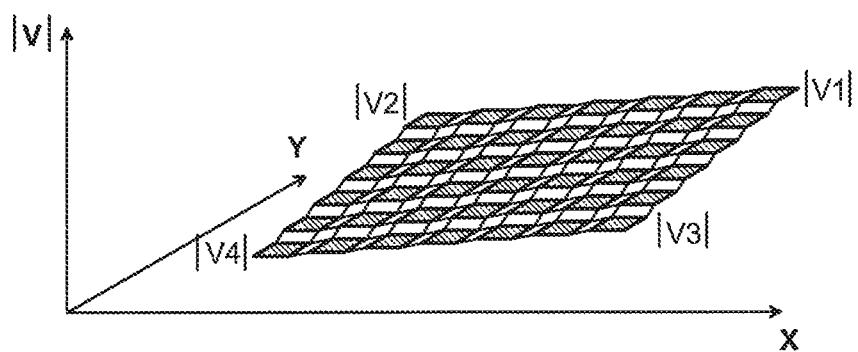
FIG. 4 illustrates an example of electric potentials of the conductive patches of FIG. 3.

FIG. 4 illustrates schematically an example of absolute values of electric potentials in a two-dimensional array of conductive patches. We assume that the conductivity of each patch is high enough (compared to the conductivity of the surrounding medium) so that within an individual patch, electric potential is constant. Between patches the absolute value of electric potential decreases monotonously as a function of both decreasing X coordinate and decreasing Y coordinate.

A two-dimensional array of conductive patches like that explained above can be used as a guard structure for controllably lowering the absolute value of electric potential on a surface of a semiconductor device. Examples of how this can be accomplished in practice, and what advantages are achieved, are described in the following.

FIG. 5 illustrates schematically a simplified two-dimensional guard structure, which comprises a two-dimensional array of (here: square-shaped) conductive patches. For the ease of reference we say that the two-dimensional array has a first side 501, a second side 502, a third side 503, and a fourth side 504. On the surface of the same piece of semiconductor material are a number of electrodes that are configured to assume different electric potentials. A first subset of said electrodes are strip-formed and have their ends located adjacent to respective ones of the conductive patches along the first side 501. In FIG. 5 the first subset consists of the electrodes from 505 to 506. A second subset of said electrodes are also strip-formed and have their ends located adjacent to respective ones of the conductive patches along the third side 503. In FIG. 5 the second subset consists of the electrodes from 507 to 508.

We also assume that at or close to the corner between the second 502 and fourth 504 sides is a coupling to an electric potential of zero or other relatively small absolute value. In FIG. 5 this is schematically illustrated as the grounding connection 509. As an example, the lower right corner of the array of conductive patches may be at or close to an edge of a piece of semiconductor material with a grounding connection.

There are no direct couplings for bringing electric potentials to the square-formed conductive patches. However, there are (although not separately shown in FIG. 5) couplings for making the strip-formed electrodes assume certain electric potentials. The absolute values of the electric potential of electrodes 505 and 507 are highest, and the absolute value of electric potential decreases towards both electrode 506 and electrode 508. Under the influence of the electric potentials existing at the electrodes, and taken the somewhat limited but nevertheless existing conductivity of the underlying semiconductor material, the conductive patches assume a distribution of electric potentials that may closely resemble the one shown in FIG. 4.

The patches need not be squares or even rectangular; neither does the two principal directions of recurrence of the array need to be perpendicular to each other. Most importantly, the electrodes, the electric potentials of which cause the conductive patches to assume their respective electric potentials, need not extend in directions that would be parallel to the directions of recurrence of the array. An example of all these is shown in FIG. 6. Here the conductive patches have the form of a stretched hexagon, and the two principal directions of recurrence (which are parallel to the first 501 and second 502 sides, and to the third 503 and fourth 504 sides respectively) are at an oblique angle to each other. In this embodiment the strip-formed electrodes are all essentially parallel or close to parallel to each other, at least within the immediate neighbourhood of the array of conductive patches, and extend to a direction that is at an oblique angle to both principal directions of recurrence of the array.

FIG. 7 shows an alternative embodiment, in which the conductive patches of the two-dimensional array are not all alike in form. In many cases it is advantageous to design the conductive patches so that the physical distance between an adjacent pair of them does not have a single minimum point, in order to distribute the electric field and the currents it creates across a wider portion of the semiconductor material.

As has been shown above, the capability of a two-dimensional array of conductive patches to controllably lower the absolute value of electric potential in two different directions (which here are the two principal directions of recurrence of the array) is very illustrative in a case where the highest absolute value of electric potential exists at a corner of the array. In the examples of FIGS. 5 to 7, said corner is the upper left corner (for example in FIG. 5: the corner located at the turning point between the first 501 and third 503 sides). Depending on how many electrodes come close to such corner, and also depending on how does the array of conductive patches look like at (and close to) said corner, one of the following cases may apply:

that electrode is configured to assume the largest absolute value of electric potential that has its end located adjacent to the conductive patch located at said turning point (one electrode 701, one conductive patch 702 at the corner; see FIG. 7), at least one of those electrodes is configured to assume the largest absolute value of electric potential that have their ends located adjacent to the conductive patch located at said turning point (several electrodes, one conductive patch at the corner; see FIGS. 5 and 6), that electrode is configured to assume the largest absolute value of electric potential that has its end located adjacent to those conductive patches that are located at said turning point (one electrode 801, several conductive patches 802, 803 at the corner; see FIG. 8), at least one of those electrodes is configured to assume the largest absolute value of electric potential that have their ends located adjacent to those conductive patches that are located at said turning point (several electrodes, several conductive patches at the corner).

However, it is not necessary that the two-dimensional array has straight sides, or that it has a corner at a location where the highest absolute value of electric potential exists. FIG. 9 illustrates an example, in which the transition between a "first side" and a "third side" according to the vocabulary used above is gradual along the curved line 901. Similar gradual changes and curved forms could exist also at the other sides of the two-dimensional array.

In the examples above, the two-dimensional array of conductive patches covers what is mathematically called a "simply connected" two-dimensional area of a surface of the semiconductor device. Informally this may be characterized to mean that the array has no holes. However, this is not a requirement of the invention; for example, it is possible to build a loop-shaped two-dimensional array with at least one of said electrodes located inside the array.

Figure 10:
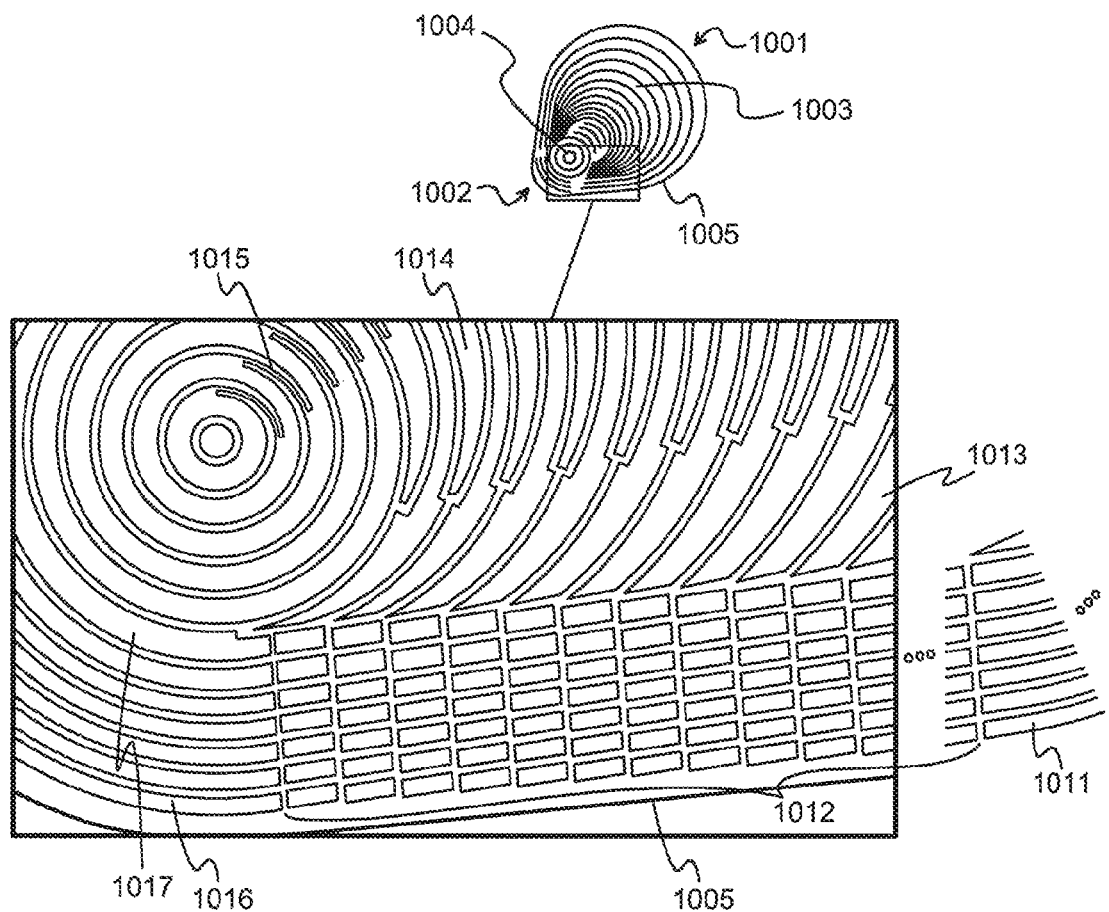
FIG. 10 illustrates the use of a two-dimensional guard structure in a droplet-formed drift detector.

FIG. 10 illustrates an embodiment of the invention in which the semiconductor device is a drift detector. It comprises a piece of semiconductor material, and is configured to collect radiation-induced charge carriers within said piece of semiconductor material under the influence of an electric field created by electric potentials of electrodes located on its surface. More particularly, it comprises an active area covered by a sequence of drift electrodes, which create inside the semiconductor material an electric field that drives said radiation-induced charges towards a collection point (anode region), which may be located within or outside the active area. In the exemplary drift detector of FIG. 10 the piece of semiconductor material has a droplet form with a wide end 1001 and a pointed end 1002, so that the active area 1003 is located within (or closer to) the wide end, and the anode region 1004 is located within (or closer to) the pointed end, outside said active area.

A drift detector like that illustrated in FIG. 10 comprises, on or close to the surface of the piece of semiconductor material, one or more guard rings that encircle a central portion of said surface. In the upper part of FIG. 10 the guard rings are schematically shown as lines that roughly follow the droplet form of the detector close to the outer rim of the piece of semiconductor material. However, as is shown in the partial enlargement, in this case the guard rings are not continuous. A two-dimensional array of conductive patches is located adjacent to and extends parallel to an edge 1005 of the piece of semiconductor material between the wide end and the pointed end. A continuous portion of each guard ring (and also of the outermost drift electrodes) circles around the more centrally located electrodes in the wide end, but is interrupted by a sequence of the conductive patches. As an example, there are shown the end 1011 of the continuous portion of the outermost guard ring and the sequence 1012 of conductive patches that constitutes the outermost line in the array shown in the partial enlargement.

The guard ring(s) would not need to comprise a continuous portion at all. In an embodiment of the invention, also the portion of the guard ring(s) that circles around the drift electrodes located in the wide end may consist of a sequence of consecutive conductive patches.

FIG. 10 shows also a number of other advantageous features that the droplet-formed drift detector may have.

Although not seen in the partial enlargement due to its selected cropping, two-dimensional arrays of conductive patches exist symmetrically along both sides of the droplet form (i.e. also along the side that extends almost straight up in the upper part of FIG. 10). Thus a majority of the drift electrodes are also not continuous rings but crescent-formed. Each crescent-formed drift electrode has one end adjacent to a conductive patch at an innermost side (in the terminology of FIG. 5: "first side") of one two-dimensional array, and another end adjacent to a conductive patch at an innermost ("first") side of the other two-dimensional array. A crescent-formed drift electrode 1013 is shown as an example.

Actually the crescent-formed drift electrodes mentioned above, i.e. the ones the ends of which are adjacent to the conductive patches at the innermost sides of the two-dimensional arrays, constitute only every second drift electrode in the expanding sequence of drift electrodes. Between each consecutive pair of them, the drift detector comprises a shorter crescent-formed drift electrode, ends of which are farther from the innermost sides of the two-dimensional arrays than the ends of the first-mentioned crescent-formed drift electrodes. Electrode 1014 is an example of these relatively shorter drift electrodes.

FIG. 10 also shows an example of how the drift electrodes are configured to assume their different electric potentials. Each pair of consecutive drift electrodes is linked together by a narrow conductive bridge of certain length, of which bridge 1015 is shown as an example. The specific conductivity and physical dimensions of each bridge are selected so that the bridge has a desired resistance, so that the drift electrodes effectively constitute a resistor-linked chain. Electric potentials only need to be specifically coupled to the first and last electrodes in the chain, after which the resistor links between them takes care of setting the electric potential of each intermediate drift electrode to the appropriate value.

Comparing to FIGS. 3 to 5, the two-dimensional array of conductive patches can be said to have the following sides:
first side: the one adjacent to the ends of the (longer ones of the) crescent-formed drift electrodes,
second side: the one adjacent to the edge 1005 of the piece of semiconductor material (although said edge may in practice be much farther from the conductive patches than in FIG. 10),
third side: the one adjacent to the ends of the continuous portions of the guard rings (and outermost drift electrodes) that encircle the wide end of the drift detector, and
fourth side: the one adjacent to the ends of the shorter continuous portions of the guard rings (and outermost drift electrodes) that bend around the pointed end of the drift detector.

The largest absolute value of electric potential in a drift detector exists at the outermost drift electrode, which according to the designations above ends at or close to the turning point between the first and third sides of the two-dimensional array of conductive patches. From there the absolute value of electric potential begins to decrease in both of the principal directions of recurrence of the two-dimensional array.

Whether or not the shorter continuous portions of the guard rings (and outermost drift electrodes), which bend around the pointed end of the drift detector at the lower left of the partial enlargement of FIG. 10, are explicitly coupled to certain electric potentials is a design choice. Even if they are not explicitly coupled, they will assume certain electric potentials due to the electric potentials of the other conductive parts nearby. At least the outermost one 1016 of these shorter continuous portions is typically coupled to a fixed electric potential of low absolute value, such as the ground potential (0V). Even the innermost one 1017 of said shorter continuous portions will not assume a very high absolute value of electric potential, because it will not go anywhere near to those of the drift electrodes that have the highest electric potentials by absolute value.

As a comparison, we may briefly consider a droplet-formed silicon drift detector of the prior art type, in which all ring-shaped electrodes (including those with the highest absolute value of electric potential) circled around the whole detector surface. This meant that in the tightly packed geometry of the pointed end, relatively large differences of electric potential occurred over relatively short distances. Moreover, if any conductive tracks (also called electric crossovers) were to be placed on the surface, for example for making connections to an integrated FET or a FET that was bump bonded to connection pads within the anode region, such tracks needed to be heavily insulated from the surface of the piece of semiconductor material in order to prevent electric breakdowns.

Figure 11:
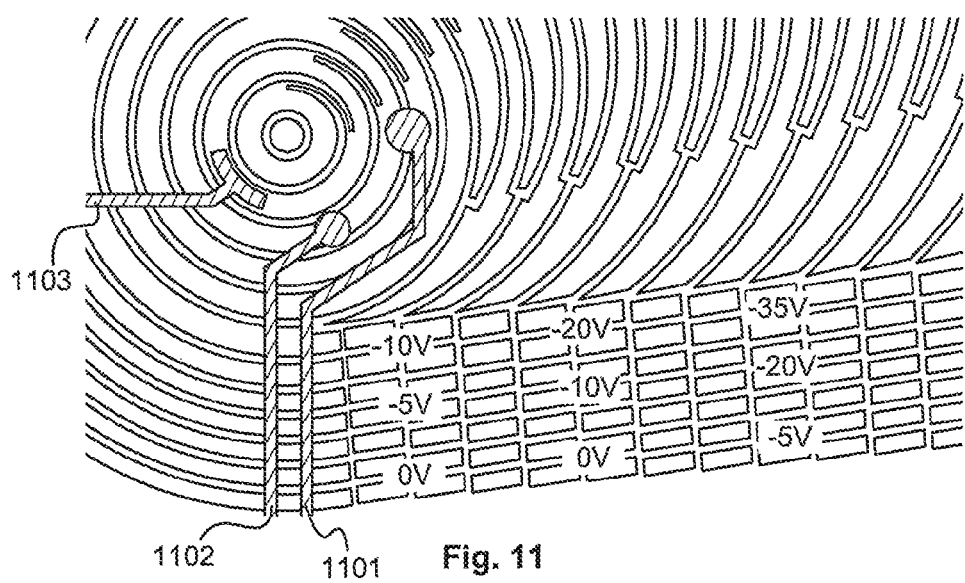
FIG. 11 illustrates conductive tracks and a two-dimensional guard structure.

In FIG. 11, an example is shown of some electric potential values within the two-dimensional array of conductive patches in a droplet-formed semiconductor radiation detector according to an embodiment of the invention. Since the electric potential values of the shorter continuous portions of guard rings and electrodes in the lower left part of FIG. 11 are the same or at least close to those shown along the left (i.e. "fourth") side of the two-dimensional array of conductive patches, the largest potential difference between a conductive track and an electrode ring it must cross is in the order of 10 volts, instead of e.g. 150 volts in a prior art device.

The device illustrated in FIG. 11 comprises at least one conductive track 1101, 1102, 1103 on at least one insulating layer (not separately shown in FIG. 11) that electrically isolates said conductive track(s) from electrodes on the surface of the piece of semiconductor material. The conductive tracks 1101, 1102, and 1103 extend to an anode region that is located within the pointed end, across electrode portions which the two-dimensional array of conductive patches separates from electrode portions circling the wide end. Since the potential differences are smaller, much less stringent requirements are placed to said insulating layer. Conductive tracks that run across ring-formed drift electrodes are known as such from e.g. a prior art document U.S. Pat. No. 6,455,858.

Figure 12:
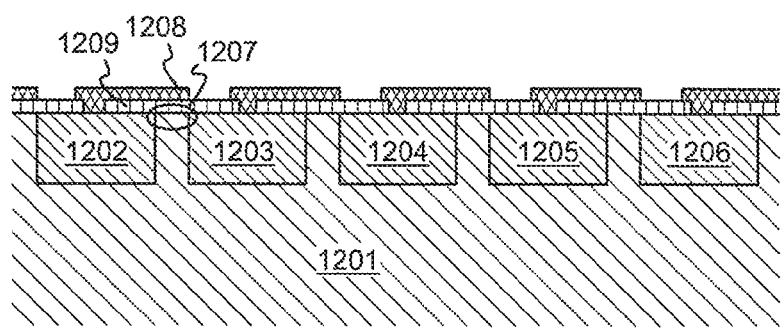
FIG. 12 illustrates the generation of surface current.
Figure 13:
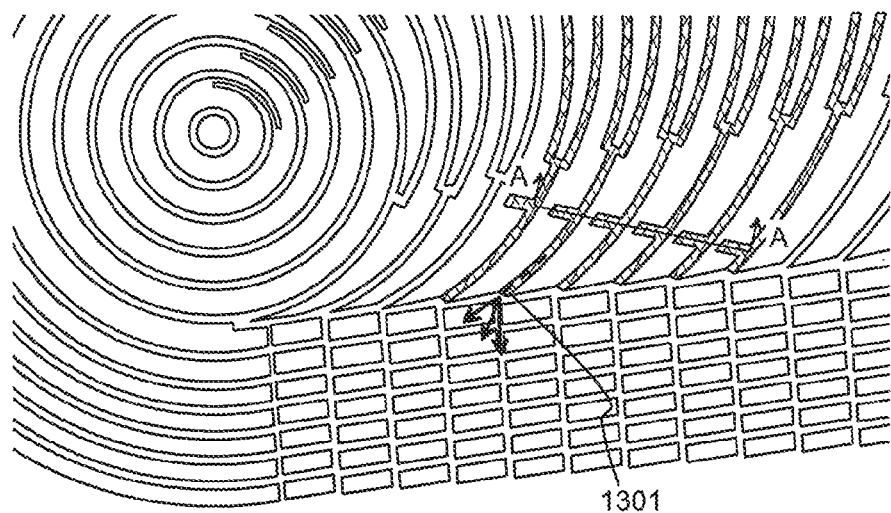
FIG. 13 illustrates the collection of surface current.

FIG. 12 is a schematic cross section of a part of a semiconductor radiation detector, particularly a drift detector, across a line A-A shown in FIG. 13. The piece 1201 of semiconductor material comprises a number of consecutive drift electrodes 1202, 1203, 1204, 1205, and 1206. Within each separation between consecutive drift electrodes, at and/or close to the surface of the piece of semiconductor material, is a region in which so-called surface currents or surface-generated charge carriers are generated. Region 1207 is shown as an example. The generation of surface-generated charge carriers is an inevitable physical fact and cannot be avoided; merely, the design of the semiconductor radiation detector should be such that surface-generated charge carriers interfere as little as possible with the generation and measurement of radiation-induced charge carriers (i.e. the so-called signal charges).

A prior art publication W. Chen at al.: "Large Area Cylindrical Silicon Drift Detector", IEEE Transactions on Nuclear Science, Vol. 39, no. 4, 1992 suggests that the presence of fixed positive charges in an oxide layer on the surface of the detector holds the surface-generated electrons close to the surface. Said publication suggests using so-called "rivers", which are sequences of gaps in the drift electrodes, to lead the electrons towards the center of the detector, where they are collected through an electrode. However, the known solution of Chen requires careful control of the gaps in the electrode rings and the provision of said collection electrode, which introduces additional complicatedness in the structure.

FIG. 12 also illustrates one possible measure that can be taken to keep the surface-generated charge carriers from interfering with the generation and measurement of signal charges. A so-called field plate 1208 is located adjacent to the separation between consecutive drift electrodes and electrically isolated therefrom by an electric insulation layer 1209. A conductive connection exists between the field plate 1208 and the drift electrode on the inner side of the separation. Said conductive connection is most easily made by arranging an opening in the electric insulation layer 1209, through which the metallization that forms the field plate 1208 makes contact with the drift electrode 1202. Due to the conductive connection, the field plate assumes the same electric potential as the drift electrode on the inner side of the separation, which should attract the surface-generated charge carriers sufficiently in order to keep them from mixing with the signal charges. A suggestion of placing conductive material over the separations between drift electrodes is known as such from e.g. the prior art publication A. Bischoff et al: "Breakdown protection and long-term stabilization for Si-detectors", Nuclear Instruments and Methods in Physics Research A326 (1993), pp. 27-37, which uses the designation "overlapping gate" for such conductive material.

FIG. 13 shows schematically how a semiconductor device according to an embodiment of the invention (here a droplet-formed drift detector), which comprises terminated drift electrodes and a two-dimensional array of conductive patches, simultaneously comes to comprise an arrangement for the collection of surface-generated charge carriers. The arrangement is configured to lead said surface-generated charge carriers out of gaps between ends of drift electrodes into the area covered by the two-dimensional array of conductive patches. The electric potential within said area is higher (i.e. less negative) than within the separations between drift electrodes, which means that surface-generated electrons will experience an attractive force towards and over the inner (i.e. "first") side of the two-dimensional array of conductive patches, as is shown with the arrow 1301 in FIG. 13. The device may comprise also field plates, which may be e.g. of the kind shown in FIG. 12, which field plates only need to attract the surface-generated charges long enough for them to flow towards and pass over the limit to the area covered by the two-dimensional array of conductive patches. Six field plates that coincide with the line A-A have been shown as cross-hatched areas.

Figure 14:
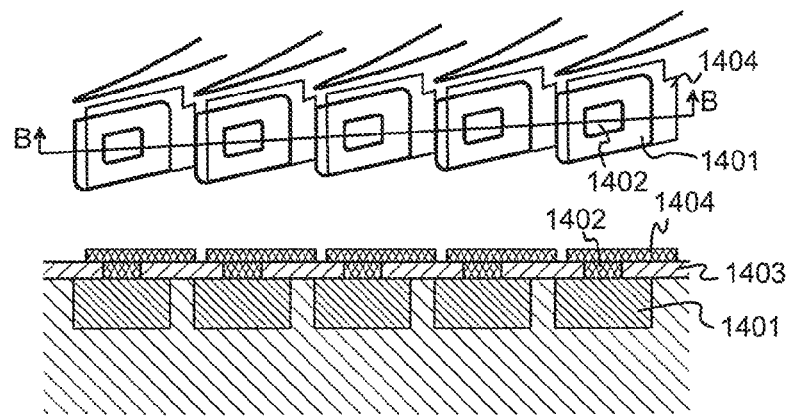
FIG. 14 illustrates field plates over conductive patches.

Kind of field plates can also be used in the two-dimensional array of conductive patches. FIG. 14 illustrates schematically five conductive patches located at the innermost (i.e. "first") side of a two-dimensional array, with also the very ends of crescent-shaped drift electrodes visible above them. The lower part of FIG. 14 illustrates a cross section along the line B-B. Each conductive patch 1401 has a conductive connection 1402 to it through an electric insulating layer 1403. On top of the last-mentioned are patch-specific "field plates" 1404, which in the horizontal direction reach over the gap between two consecutive conductive patches in the direction where a larger absolute value of electric potential is to appear. This form of conductive-patch-specific field plates ensures applying the most appropriate attractive force to surface-generated charge carriers within the area covered by the two-dimensional array of conductive patches.

Variations and modifications are possible to the embodiments described above, without parting from the scope of protection defined by the appended claims. For example, even if droplet-formed semiconductor radiation detectors have been described as examples, a two-dimensional array of conductive patches can be used as a guard structure also in the more traditional round detectors. The invention does not limit the way in which the detection and amplification element (typically the FET) is implemented, but allows using for example integrated, bump bonded or wire bonded FETs.

I claim:

1. A guard structure for a semiconductor device, comprising: a two-dimensional array of conductive patches on a surface of said semiconductor device, comprising a contiguous area of conductive patches located at or near an edge of said surface, at least some of which are left to assume an electric potential under the influence of electric potentials existing at sides of said two-dimensional array for controllably lowering absolute value of electric potential on said surface, and one or more guard rings that encircle a central portion of said surface, wherein at least one of said guard rings is interrupted by a sequence of said conductive patches.

2. A guard structure according to claim 1, wherein said two-dimensional array covers a simply connected two-dimensional area of said surface of said semiconductor device.

3. A semiconductor device, comprising:
a piece of semiconductor material,
on a surface of said piece of semiconductor material, a number of electrodes configured to assume different electric potentials, and
a guard structure comprising a two-dimensional array of conductive patches on said surface of said piece of semiconductor material, at least some of which are left to assume an electric potential under the influence of electric potentials existing at said electrodes for controllably lowering absolute value of electric potential on said surface, and one or more guard rings that encircle a central portion of said surface, wherein at least one of said guard rings is interrupted by a sequence of said conductive patches.

4. A semiconductor device, comprising:
a piece of semiconductor material,
on a surface of said piece of semiconductor material, a number of electrodes configured to assume different electric potentials,
a guard structure comprising a two-dimensional array of conductive patches, at least some of which are left to assume an electric potential under the influence of electric potentials existing at said electrodes,
said two-dimensional array has a first side; a second side opposite to said first side; a third side; and a fourth side opposite to said third side,
said second side is adjacent to an edge of the piece of semiconductor material,
a first subset of said electrodes are strip-formed and have ends located adjacent to respective ones of the conductive patches along said first side, and a second subset of said electrodes are strip-formed and have ends located adjacent to respective ones of the conductive patches along said third side.

5. A semiconductor device according to claim 4, wherein:
among said first and second subset of electrodes, that or at least one of those are configured to assume the largest absolute value of electric potential that has or have their end or ends located adjacent to that conductive patch or those conductive patches that is or are located at a turning point between said first and third sides.

6. A semiconductor device, comprising:
a piece of semiconductor material;
on a surface of said piece of semiconductor material, a number of electrodes configured to assume different electric potentials, and
a guard structure comprising a two-dimensional array of conductive patches on said surface of said piece of semiconductor material, at least some of which are left to assume an electric potential under the influence of electric potentials existing at said electrodes for controllably lowering absolute value of electric potential on said surface, wherein
the semiconductor device is a drift detector configured to collect radiation-induced charge carriers within said piece of semiconductor material under the influence of an electric field created by electric potentials of said electrodes,
the semiconductor device comprises, on said surface of said piece of semiconductor material, one or more guard rings that encircle a central portion of said surface,
at least one of said guard rings comprises a sequence of said conductive patches.

7. A semiconductor device according to claim 6, wherein:
the piece of semiconductor material has a droplet form with a wide end and a pointed end,
a portion of said at least one of said guard rings circles around electrodes located in said wide end, and
said sequence of conductive patches extends parallel to an edge of the piece of semiconductor material between said wide end and said pointed end.

8. A semiconductor device according to claim 7, comprising:

two-dimensional arrays of conductive patches along both sides of said droplet form, and
a number of crescent-formed drift electrodes on said surface in said wide end, each crescent-formed drift electrode having one end adjacent to a conductive patch at an innermost side of one two-dimensional array and another end adjacent to a conductive patch at an innermost side of the other two-dimensional array.

9. A semiconductor device according to claim 8, wherein:
said crescent-formed drift electrodes, the ends of which are adjacent to conductive patches at the innermost sides of the two-dimensional arrays, constitute every second drift electrode in an expanding sequence of drift electrodes,
the semiconductor device comprises, between each consecutive pair of said crescent-formed drift electrodes, a shorter crescent-formed drift electrode, ends of which are farther from said innermost sides of the two-dimensional arrays than the ends of said every second drift electrode.

10. A semiconductor device according to claim 7, wherein:
the semiconductor device comprises at least one conductive track on at least one insulating layer that electrically isolates said conductive track from electrodes on said surface, and
said conductive track extends to an anode region located within said pointed end across electrode portions that said two-dimensional array of conductive patches separates from electrode portions circling said wide end.

11. A semiconductor device according to claim 6, comprising an arrangement for the collection of surface-generated charge carriers, which arrangement is configured to lead said charge carriers out of gaps between ends of drift electrodes and into an area covered by said two-dimensional array of conductive patches.

12. A semiconductor device according to claim 11, wherein said arrangement comprises a number of conductive field plates located adjacent to respective separations between consecutive drift electrodes and electrically isolated from said separations by an electric insulation layer.

* * * * *